United States Patent
Lee et al.

(10) Patent No.: US 6,943,585 B2
(45) Date of Patent: Sep. 13, 2005

(54) INPUT BUFFER CIRCUIT

(75) Inventors: Jae Jin Lee, Kyoungki-do (KR); Kang Seol Lee, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 41 days.

(21) Appl. No.: 10/694,966

(22) Filed: Oct. 28, 2003

(65) Prior Publication Data

US 2004/0090242 A1 May 13, 2004

(30) Foreign Application Priority Data

Oct. 30, 2002 (KR) .................................. 10-2002-0066511

(51) Int. Cl.[7] ........................................ H03K 19/0948
(52) U.S. Cl. ............................ 326/58; 326/68; 327/108
(58) Field of Search ............................. 326/57, 58, 68, 326/83, 86; 327/77, 108

(56) References Cited

U.S. PATENT DOCUMENTS 5,440,248 A * 8/1995 Brown et al. .................. 326/71
6,480,030 B1 * 11/2002 Taguchi ........................ 326/86
6,670,836 B1 * 12/2003 Zivanovic .................... 327/170

* cited by examiner

Primary Examiner—Daniel Chang
(74) Attorney, Agent, or Firm—Ladas & Parry LLP

(57) ABSTRACT

Disclosed is an input apparatus used in a SSTL interface, which comprises a differential buffer for comparing an external input signal with a reference potential inputted from an external, and a CMOS buffer for buffering the external input signal. In the input apparatus, the CMOS buffer operates when a command signal or an address signal is not inputted from an external, and when a predetermined operation such as a refresh operation is performed, thereby reducing the power consumption in a standby mode. Further, in order to prevent the input apparatus from abnormally operating when the reference potential is not maintained in the normal operation range, a reference potential level detecting circuit is further included in the input apparatus, so that the CMOS buffer operates when the reference potential deviates from a predetermined normal operation range. Furthermore, in order to enable an input buffer to operate as the CMOS when an input signal fully swings, a circuit for detecting a potential of an input signal inputted from an external is further included in the input apparatus.

10 Claims, 4 Drawing Sheets

INPUT BUFFER CIRCUIT

BACKGROUND OF THE INVENTION

1. Field of the Invention

The present invention relates to an input apparatus used in a SSTL interface, and more particularly to an input buffer circuit having a differential buffer and a CMOS buffer as input buffers, which enables the CMOS buffer to operate in a predetermined operation such as a refresh operation, thereby preventing a current consumption from the input buffers in a standby mode and reducing the current consumption.

2. Description of the Prior Art

The SSTL interface enables a potential of a signal inputted from an external to move above or below a predetermined reference potential (e.g. 1.4V) with a variation within a predetermined potential (e.g. 0.4V), instead of moving between a source potential and a ground potential.

A differential buffer circuit is mainly utilized as an input apparatus used in such a SSTL interface.

FIG. 1 is a circuit diagram of an input buffer in a conventional SSTL interface. An external input signal EXTIN represents an address signal, a control signal and a data signal, etc. As shown in FIG. 1, the input buffer is constructed by a differential comparison circuit 1 controlled by a control signal CTRL. The external input signal EXTIN is compared with a reference potential Vref, which is inputted from an external, to be outputted as an input signal INt2 of the SSTL interface. That is, two NMOS transistors N1 and N2 are respectively controlled by the external input signal EXTIN and the reference potential Vref. Further, by the control signal CTRL, two PMOS transistors P1/P4 and a NMOS transistor N3 function as a current source of the transistors N1 and N2 for the differential comparison. The input circuit as shown in FIG. 1 is called a differential input apparatus, and FIG. 1 shows other signals excepting a data signal from among the external input signals.

However, the conventional circuit as shown in FIG. 1 has a problem in that the circuit consumes a electric power even in a standby state.

That is, the buffers operate and consume electric power even in a predetermined time period for which the input apparatus does not operate. For instance, even though an external command signal is not inputted while a refresh operation is performed, these input apparatuses (command and address buffer) are turned on, thereby consuming a current.

Further, when the reference potential Vref varies, these input apparatuses do not normally operate. For instance, in the case of a standby mode in which a command signal is not inputted from an external in order to reduce a power consumption of a semiconductor apparatus, the reference potential Vref is floated. Herein, the reference potential Vref signal is changed into a ground potential, so that an abnormal operation may occur.

SUMMARY OF THE INVENTION

Accordingly, the present invention has been made to solve the above-mentioned problems occurring in the prior art, and a first object of the present invention is to provide an input buffer circuit, in which a CMOS input apparatus operates in a predetermined operation (i.e. an input apparatus enables a CMOS buffer to operate when a refresh operation is performed), so as to prevent a differential buffer from operating and consuming electric power even without a command signal or an address signal inputted from an external.

A second object of the present invention is to provide an input buffer circuit which detects a reference potential and enables a CMOS buffer to operate when the reference potential deviates from a predetermined normal operation range, so as to prevent an abnormal operation of the buffer when the reference potential is not maintained (kept) in the normal operation range.

A third object of the present invention is to provide an input buffer circuit which detects a potential of a signal inputted from an external and enables a CMOS buffer to operate when a level of potential inputted from an external is enough, in order to enable an input buffer to operate as a CMOS when an input apparatus fully swings.

In short, it is an object of the present invention to provide an input circuit apparatus which uses a CMOS buffer when a semiconductor device is in a standby mode state, and uses a differential amplifier input buffer when the semiconductor device is in an active mode state.

In order to achieve the above objects, according to one aspect of the present invention, there is provided an input buffer circuit comprising: a differential buffer for differentially comparing a reference potential with an external input signal and buffering the compared signal; a CMOS buffer for buffering the external input signal through a CMOS; and a control section for logically combining an enable signal inputted from an external and a control signal, operating the differential buffer in a normal operation state in which the control signal is high, and operating the CMOS buffer in a standby state in which the control signal is low, and an output section NANDs an output signal of the differential buffer and an output signal of the CMOS buffer, and then outputs as an input signal of a SSTL interface.

Wherein the control section includes a first NAND gate for NANDing the enable signal and the control signal, a second inverter for inverting an output signal of the first NAND gate and outputting as a control signal of the differential buffer, a first inverter for inverting the control signal, a second NAND gate for NANDing the enable signal and the control signal inverted by the first inverter, and a third inverter for inverting an output signal of the second NAND gate and outputting as an operation control signal of the CMOS buffer.

The present invention further comprises a reference potential level detecting circuit which detects a level of the external reference potential and generates the control signal which enables the differential buffer to operate only when the level is maintained in a normal operation range and the CMOS buffer to operate when the level deviates from the normal operation range.

Wherein the reference potential level detecting circuit comprises a first and second reference potential generating section for respectively generating a first and second reference potential to set a normal operation range of the external reference potential, a first comparison section operated by an enable signal inputted from an external to differentially compare the first reference potential with the external reference potential, a second comparison section operated by an enable signal inputted from an external to differentially compare the second reference potential with the external reference potential, and a control signal generating section for logically combining outputs of the first and the second reference potential comparison section, generating a control signal which enables the differential buffer to operate only when the external reference potential is located between the first reference potential and the second reference potential, and the CMOS buffer to operate in other cases.

The present invention further comprises an input signal potential detecting circuit for generating a control signal which enables the CMOS buffer to operate when a potential of the external input signal fully swings.

Wherein the input signal potential detecting circuit comprises a first and a second reference potential generating section for respectively generating a first and a second reference potential Vref2 to understand whether or not the external input signal fully swings, a first comparison section operated by an enable signal inputted from an external to differentially compare the first reference potential with the external input signal, a second comparison section operated by an enable signal inputted from an external to differentially compare the second reference potential with the external input signal, a first latch section for receiving an output signal of the first comparison section, an inverted output signal of the first comparison section, latching the received signals, and outputting a control signal which enables the CMOS buffer to operate when the external input signal fully swings, according as the external input signal fully swings or changes a little, and a second latch section for receiving an output signal of the second comparison section, an inverted output signal of the first comparison section, latching the received signals, and outputting a control signal which enables the CMOS buffer to operate when the external input signal fully swings, according as the external input signal fully swings or changes a little.

In order to achieve the above objects, according to one aspect of the present invention, there is provided an input buffer circuit comprising; a first input buffer for receiving an external input signal applied from an external of a semiconductor device; a second input buffer for receiving an external reference voltage and the external input signal; and a control means for generating a control signal selecting the first input buffer or the second input buffer, wherein the first input buffer operates when the control signal is a signal having a first level, and the second input buffer operates when the control signal is a signal having a second level, wherein the control signal ENABLEs the first input buffer when a potential level of the external input signal is smaller than a first reference voltage or larger than a second reference voltage, and the control signal ENABLEs the second input buffer when the potential level of the external input signal is located between the first reference voltage and the second reference voltage. Wherein the first input buffer is a CMOS buffer, and the second input buffer is a differential input buffer.

In order to achieve the above objects, according to one aspect of the present invention, there is provided a input buffer circuit comprising: a first input buffer for receiving an external input signal applied from an external of a semiconductor device; a second input buffer for receiving an external reference voltage and the external input signal; and a control means for selecting the first input buffer when a mode of the semiconductor device is in a standby mode and selecting the second input buffer when the mode of the semiconductor device is in an active mode.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

Figure 1:
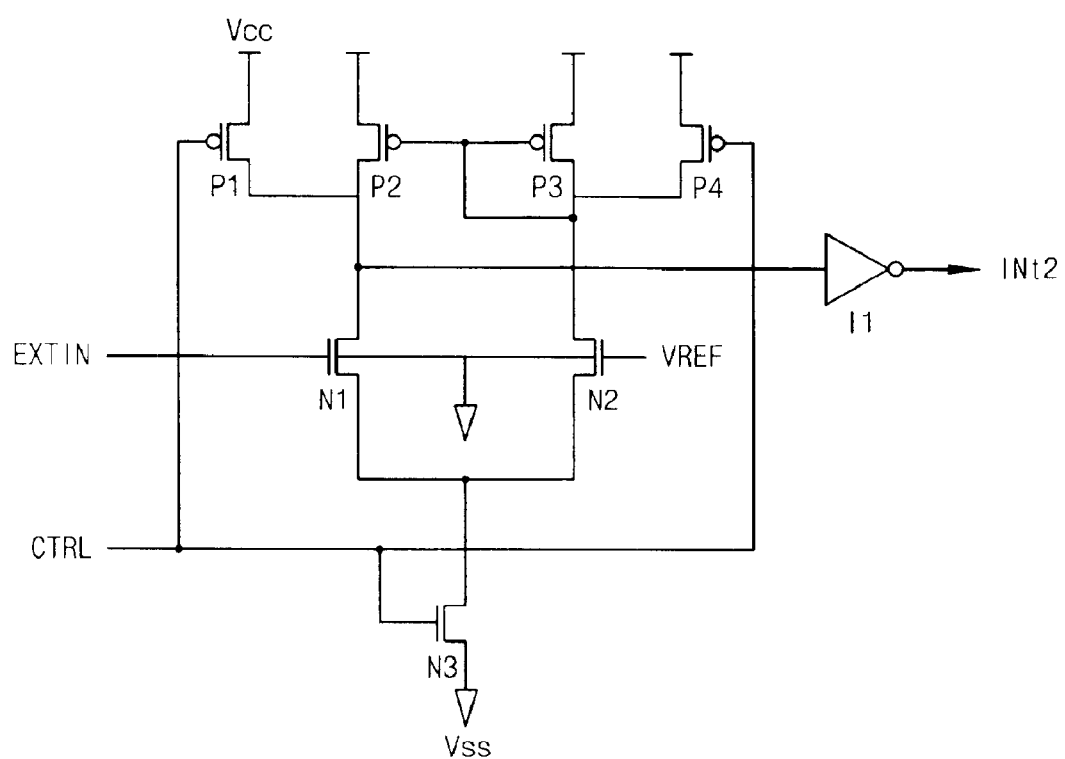
FIG. 1 is a circuit diagram of an input buffer in a conventional SSTL interface.
Figure 2:
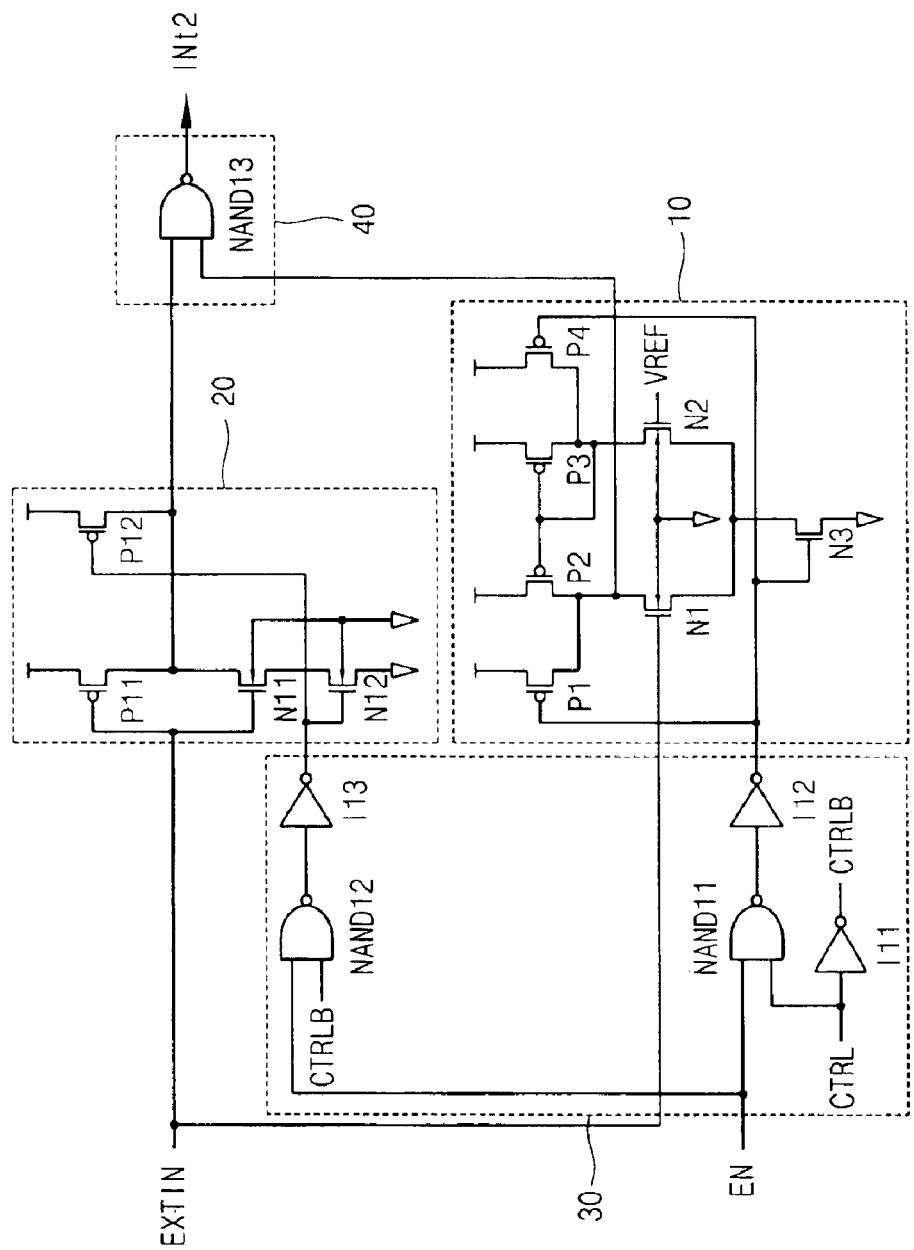
FIG. 2 is a circuit diagram of an input buffer in a SSTL interface input apparatus according to the present invention.

FIG. 2 is a circuit diagram of an input buffer according to the present invention.

The input buffer according to the present invention includes a differential buffer 10, a CMOS buffer 20, a control section 30, and an output section 40. The differential buffer 10 differentially compares a reference potential Vref with an external input signal EXTIN and buffers. The CMOS buffer 20 buffers the external input signal EXTIN. The control section 30 logically combines an enable signal EN inputted from an external and a control signal CTRL to operate the differential buffer 10 in a normal operation state in which the control signal CTRL is high, and operate the CMOS buffer 20 in a standby state in which the control signal CTRL is low. The output section 40 NANDs an output signal of the differential buffer 10 and an output signal of the CMOS buffer 20, and then outputs as an input signal Int2 of a SSTL interface.

The CMOS buffer 20 includes a PMOS and a NMOS transistor P11 and N11, a NMOS transistor N12, and a PMOS transistor P12. The PMOS and the NMOS transistor P11 and N11 respectively receive the external input signal EXTIN through gate terminals, and then invert and output the received signal. The NMOS transistor N12 functions as a bypass current source of the NMOS transistor N11 according to a control signal when the control signal of the control section 30 is low. The PMOS transistor P12 functions as a pull-up of an output signal on the basis of the control signal of the control section 30.

The control section 30 includes a first NAND gate NAND11, a second inverter I12, a first inverter I11, a second NAND gate NAND12, and a third inverter I13. The first NAND gate NAND11 NANDs the enable signal EN and the control signal CTRL, and the second inverter I12 inverts an output signal of the first NAND gate NAND11 and then applies it as a control signal of the differential buffer 10. The first inverter I11 inverts the control signal CTRL, and the second inverter I12 NANDs the enable signal EN and a control signal CTRLB inverted by the first inverter I11. The third inverter I13 inverts an output signal of the second NAND gate NAND12 and then outputs it as an operation control signal of the CMOS buffer 20.

The output section 40 includes a third NAND gate NAND13 which NANDs the output signal of the CMOS buffer 20 and the output signal of the differential buffer 10.

In the buffer circuit of the present invention constructed as above, when the control signal CTRL is high, the first NAND gate NAND11 of the control section 30 outputs a low signal. Then, the low signal is inverted by the second inverter I12 and applied to the differential buffer 10 as a high signal.

When the high signal is applied to the differential buffer 10, a NMOS transistor N3 in the differential buffer 10, which is a bypass current source, is turned on to normally operate. That is, the differential buffer 10 compares the external input signal EXTIN with the reference potential Vref, which is a external input, and then sends the external input signal EXTIN.

Herein, when the control signal CTRL is a high signal, the inverted control signal CTRLB becomes a low signal, and then the second NAND gate NAND12 outputs a high signal. Further, the third inverter I13 inverts the high signal of the second NAND gate NAND12 and applies the inverted signal (i.e. a low signal) to the CMOS buffer 20, so that the NMOS transistor N12, which is a bypass current source of the CMOS buffer 20, is turned off to output only high signal regardless of external input signal EXTIN. That is, the CMOS buffer 20 does not operate.

When the control signal CTRL is low, a low signal is applied to the differential buffer 10 by an operation of the control section 30, and a high signal is applied to the CMOS buffer 20 as a control signal, so that the CMOS buffer 20 normally operates.

As a result, in an operation state in which the control signal CTRL is high, the differential buffer 10 normally operates. In contrast, in a state in which the control signal CTRL is low, only the CMOS buffer 20 operates. That is, when a command signal or an address signal is not inputted from an external, the differential buffer 10 does not operate, so that a current consumption can be prevented. In this state, when a signal is inputted from an external, the CMOS buffer 20 operates (e.g. in performing a refresh operation) and sends the inputted signal.

Figure 3:
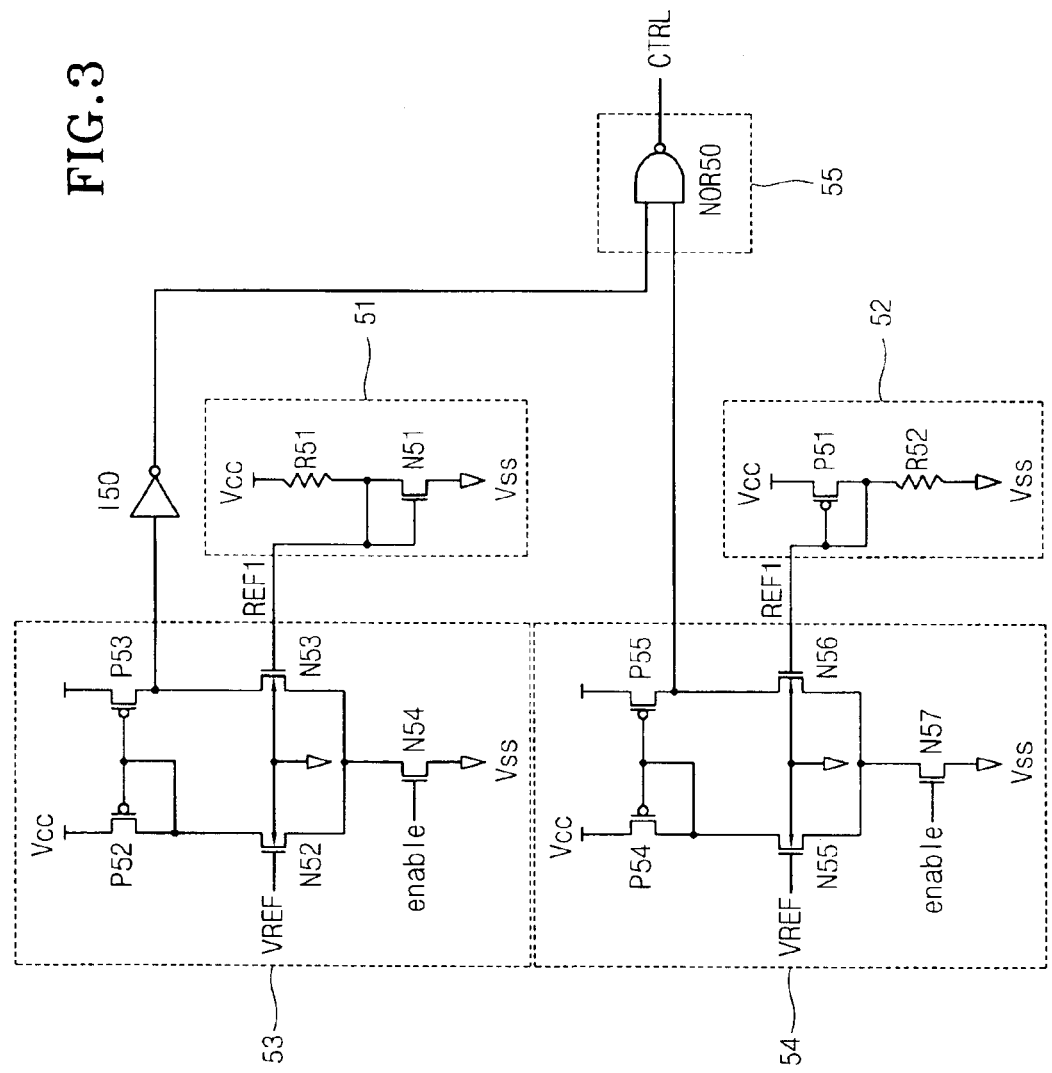
FIG. 3 is a circuit diagram of a circuit for detecting a level of a reference potential in an input buffer circuit according to the present invention.

FIG. 3 is a circuit diagram of a circuit for detecting a level of an external input reference potential according to the present invention.

The circuit includes a first reference potential generating section 51, a second reference potential generating section 52, a first reference potential comparison section 53, a second reference potential comparison section 54, and a control signal generating section 55.

The first reference potential generating section 51 generates a predetermined potential Vt as a first reference potential Vref1 from an inside by means of a supply voltage. Herein, the predetermined potential Vt controls a control signal CTRL, which is inputted to the control section 30 from an external, according to change of a reference potential Vref inputted from an external. The second reference potential generating section 52 generates a predetermined potential Vcc-vt as a second reference potential Vref2 from an inside by means of a supply voltage. The first reference potential comparison section 53 is operated by an enable signal EN, which is inputted from an external, to differentially compare the first reference potential Ref1 with the reference potential Vref inputted from the external. The second reference potential comparison section 54 is operated by an enable signal EN, which is inputted from an external, to differentially compare the second reference potential Vref2 with the reference potential Vref inputted from the external. The control signal generating section 55 logically combines outputs of the first reference potential comparison section 53 and the second reference potential comparison section 54, to operate the differential buffer 10 only when the reference potential Vref inputted from the external is located between the first reference potential Vt and the second reference potential Vcc-vt. Further, in other cases, the control signal generating section 55 generates a control signal CTRL which enables the CMOS buffer 20 to operate.

The control signal generating section 55 includes a NOR gate NOR50 which NORs a signal, which is obtained by inverting an output signal of the first reference potential comparison section 53 through an inverter I50, and an output signal of the second reference potential comparison section 54, to output the control signal CTRL.

The reference potential level detecting circuit constructed as above outputs a low signal to an output terminal when the reference potential Vref inputted from the external is smaller than a reference potential generated from an inside, thereby controlling the CMOS buffer 20 to operate.

When the reference potential Vref inputted from the external is smaller than the first reference potential Vref1 (i.e. Vt), a NMOS transistor N53 in the first reference potential comparison section 53 is turned on to output a low signal. The low signal is inverted by the inverter I50 to be inputted to the NOR gate NOR50, so that the NOR gate NOR50 outputs a low signal as the control signal CTRL regardless of an output signal of the second reference potential comparison section 54. In this case, the CMOS buffer 20 operates.

When the reference potential Vref inputted from the external is higher than the second reference potential Vref2 (i.e. Vcc-vt), a NMOS transistor N55 in the second reference potential comparison section 54 is turned on and a NMOS transistor N56 receiving the second reference potential Vref2 from a gate terminal is turned off. Therefore, a high signal is outputted, so that the NOR gate NOR50 of the control signal generating section 55 outputs a low signal as the control signal CTRL regardless of an output signal of the first reference potential comparison section 53, thereby enabling the CMOS buffer 20 to operate.

In the present invention as described above, the differential buffer 10 operates only when the reference potential Vref inputted from the external is located between the first reference potential Vref1 (i.e. Vt) and the second reference potential Vref2 (i.e. Vcc-vt). Further, in other cases, the control signal CTRL is generated to operate the CMOS buffer 20.

Figure 4:
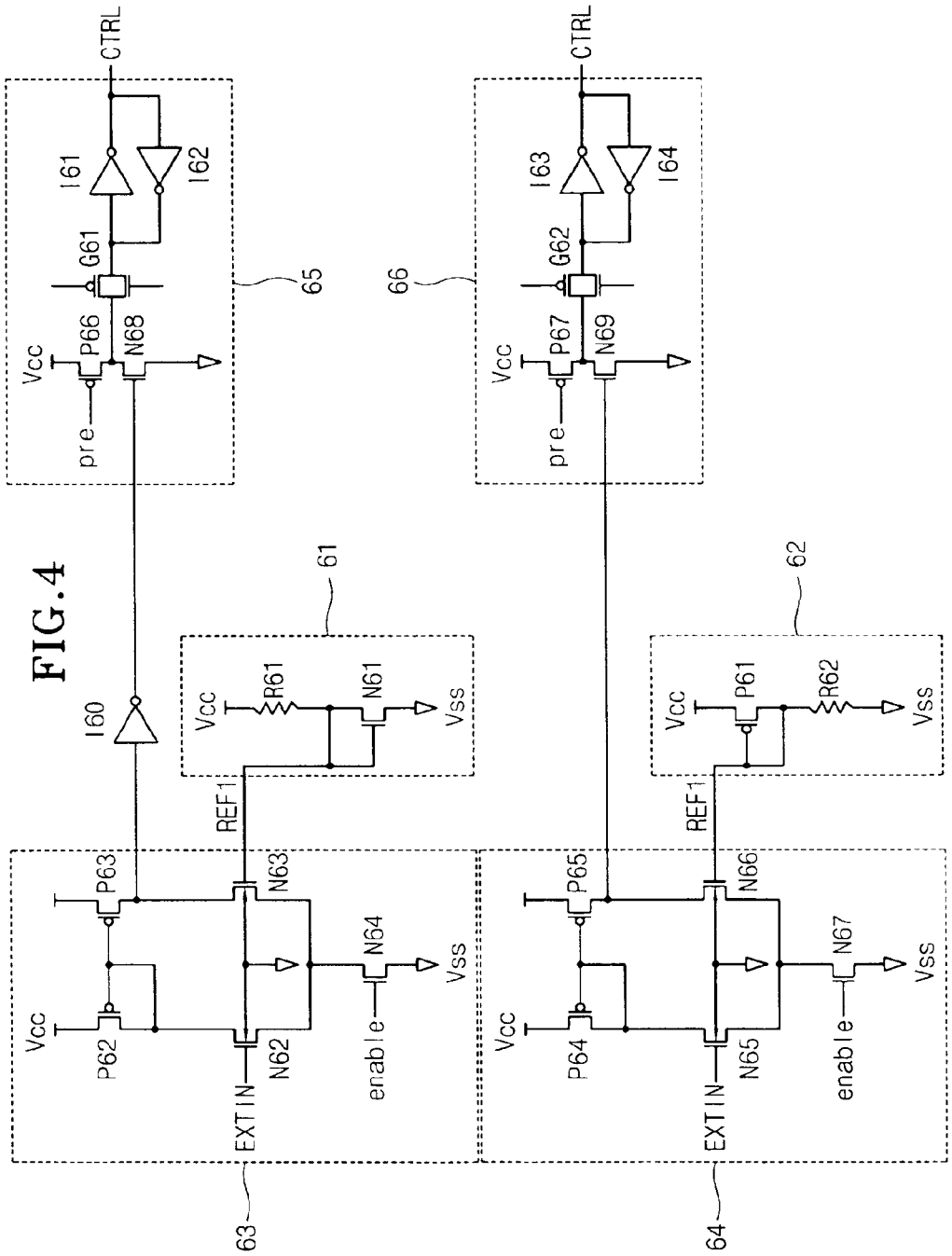
FIG. 4 is a circuit diagram of a circuit for detecting a potential of external input signal in an input buffer circuit according to the present invention.

FIG. 4 is a circuit diagram of a circuit for detecting a potential of an input signal according to the present invention.

The circuit includes a first and a second reference potential generating section 61 and 62, a first and a second comparison section 63 and 64, a first latch section 65, and a second latch section 66. The first and the second reference potential generating section 61 and 62 respectively generate a first reference potential Vref1 and a second reference potential Vref2 from an inside in order to compare potentials of input signals. The first comparison section 63 differentially compares an external input signal EXTIN with the first reference potential Vref1, and the second comparison section 64 differentially compares the external input signal EXTIN with the second reference potential Vref2. The first latch section 65 receives the output signal of the first comparison section 63 through an inverter I60, allows the signal to pass through MOS transistors P66/N68 and a pass gate G61 and to be latched by inverters I61 and I62 constructed by a closed circuit, and then outputs as a control signal CTRL. The second latch section 66 passes the output signal of the second comparison section 64 through MOS transistors P67/N69 and a pass gate G62, latches it by inverters I63 and I64 constructed by a closed circuit, and then outputs a control signal CTRL.

The circuit constructed as above detects whether a potential of an input signal inputted from an external fully swings or changes a little.

When the input signal EXTIN is smaller than the first reference potential Vref1, a NMOS transistor N63 in the first comparison section 63 is turned on to output a low signal. Further, the low signal is inputted to the first latch section 65 through the inverter I60, and the first latch section 65 latches the signal and then outputs a control signal to operate the CMOS buffer 20.

Further, when the input signal EXTIN is higher than the second reference potential Vref2, the output signal of the second comparison section 64 becomes a high signal and is then latched by the second latch section 66. Accordingly, the second latch section 66 outputs a control signal to operate the CMOS buffer 20.

Since this means that an input signal swings, the CMOS buffer 20 operates in this operation. Herein, the operation is not always performed but performed only for a predetermined time. Further, the result from the operation is latched and stored. Herein, the predetermined operation time represents a predetermined time after an initial power-up, and the time can be adjusted by an enable signal.

In the present invention as described above, a CMOS buffer circuit is added to a differential buffer circuit, and a control section for selecting the differential buffer circuit and the CMOS buffer circuit is included, so that only the CMOS buffer circuit operates instead of the differential buffer circuit while a predetermined operation (e.g. a refresh operation), in which an external command signal is not inputted, is performed, and therefore a current consumption can be reduced. Further, after a level of a reference potential of a signal inputted from an external is detected, the differential buffer circuit operates when the level belongs to a normal operation range, and the CMOS buffer circuit operates when the level deviates from the normal operation range, so that a normal operation can be performed even when an external input reference potential changes. Furthermore, after a potential of an input signal inputted from an external is detected, the CMOS buffer circuit operate when the potential of the input signal swings, so that the input buffer circuit according to the present invention can operate as a stable input apparatus.

The preferred embodiment of the present invention has been described for illustrative purposes, and those skilled in the art will appreciate that various modifications, additions and substitutions are possible, without departing from the scope and spirit of the invention as disclosed in the accompanying claims.

What is claimed is:

1. An input buffer circuit comprising:
  a first input buffer for receiving an external input signal applied from an external of a semiconductor device;
  a second input buffer for receiving an external reference voltage and the external input signal; and
  a control means for generating a control signal selecting the first input buffer or the second input buffer,
  wherein the first input buffer operates when the control signal is a signal having a first level, and the second input buffer operates when the control signal is a signal having a second level,
  wherein the control signal enables the first input buffer when a potential level of the external input signal is smaller than a first reference voltage or larger than a second reference voltage, and the control signal enables the second input buffer when the potential level of the external input signal is located between the first reference voltage and the second reference voltage.

2. The input buffer circuit according to claim 1, wherein the first input buffer is a CMOS buffer, and the second input buffer is a differential input buffer.

3. An input buffer circuit comprising:
  a first input buffer for receiving an external input signal applied from an external of a semiconductor device;
  a second input buffer for receiving an external reference voltage and the external input signal; and
  a control means for selecting the first input buffer when a mode of the semiconductor device is in a standby mode and selecting the second input buffer
  when the mode of the semiconductor device is in an active mode
  wherein the control means receives an external reference voltage and compares the external reference voltage with an internal reference voltage and then outputs a control signal to select one of the first and second input buffers.

4. The input buffer circuit according to claim 3, wherein the first input buffer is a CMOS buffer, and the second input buffer is a differential input buffer.

5. An input buffer circuit used in a SSTL interface, the input buffer circuit comprising:
  a differential buffer for differentially comparing a reference potential with an external input signal and buffering the compared signal;
  a CMOS buffer for buffering the external input signal through a CMOS; and
  a control section for logically combining an enable signal inputted from an external and a control signal, operating the differential buffer when the control signal is in a normal operation state, and operating the CMOS buffer when an input signal including at least one of a command signal and an address signal, is not input from an external, and when a refresh operation is performed.

6. The input buffer circuit according to claim 5, wherein the control section includes a first NAND gate for NANDing the enable signal and the control signal, a second inverter for inverting an output signal of the first NAND gate and outputting as a control signal of the differential buffer, a first inverter for inverting the control signal, a second NAND gate for NANDing the enable signal and the control signal inverted by the first inverter, and a third inverter for inverting an output signal of the second NAND gate and outputting as an operation control signal of the CMOS buffer.

7. The input buffer circuit according to claim 5, further comprising a reference potential level detecting circuit which detects a level of the external reference potential and generates the control signal which enables the differential buffer to operate only when the level is maintained in a normal operation range and the CMOS buffer to operate when the level deviates from the normal operation range.

8. The input buffer circuit according to claim 7, wherein the reference potential level detecting circuit comprises a first and second reference potential generating section for respectively generating a first and second reference potential to set a normal operation range of the external reference potential, a first comparison section operated by an enable signal inputted from an external to differentially compare the first reference potential with the external reference potential, a second comparison section operated by an enable signal inputted from an external to differentially compare the second reference potential with the external reference potential, and a control signal generating section for logically combining outputs of the first and the second reference potential comparison section, generating a control signal which enables the differential buffer to operate only when the external reference potential is between the first reference potential and the second reference potential.

9. The input buffer circuit according to claim 5, further comprising an input signal potential detecting circuit for generating a control signal which enables the CMOS buffer to operate when a potential of the external input signal fully swings.

10. The input buffer circuit according to claim 9, wherein the input signal potential detecting circuit comprises a first and a second reference potential generating section for respectively generating a first and a second reference potential Vref2 to understand whether or not the external input signal fully swings, a first comparison section operated by an enable signal inputted from an external to differentially compare the first reference potential with the external input signal, a second comparison section operated by an enable signal inputted from an external to differentially compare the second reference potential with the external input signal, a first latch section for receiving an output signal of the first comparison section, an inverted output signal of the first comparison section, latching the received signals, and outputting a control signal which enables the CMOS buffer to operate when the external input signal fully swings, according as the external input signal fully swings or changes a little, and a second latch section for receiving an output signal of the second comparison section, an inverted output signal of the first comparison section, latching the received signals, and outputting a control signal which enables the CMOS buffer to operate when the external input signal fully swings, according as the external input signal fully swings or changes a little.

* * * * *